United States Patent
Min et al.

(10) Patent No.: US 7,029,941 B2
(45) Date of Patent: Apr. 18, 2006

(54) MAGNETIC RANDOM ACCESS MEMORY DESIGNS WITH CONTROLLED MAGNETIC SWITCHING MECHANISM

(75) Inventors: Tai Min, San Jose, CA (US); Po Kang Wang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 232 days.

(21) Appl. No.: 10/647,716

(22) Filed: Aug. 25, 2003

(65) Prior Publication Data

US 2005/0047241 A1    Mar. 3, 2005

(51) Int. Cl.
*H01L 21/00* (2006.01)

(52) U.S. Cl. ............. 438/48; 257/421; 257/E27.006; 257/295

(58) Field of Classification Search ............. None
See application file for complete search history.

(56) References Cited

U.S. PATENT DOCUMENTS

| | | | |
|---|---|---|---|
| 5,757,695 A | 5/1998 | Shi et al. ............. | 365/158 |
| 6,005,800 A | 12/1999 | Koch et al. .......... | 365/173 |
| 6,205,053 B1 | 3/2001 | Anthony .............. | 365/173 |
| 6,242,770 B1 | 6/2001 | Bronner et al. ...... | 257/295 |
| 2002/0130339 A1* | 9/2002 | Kishi et al. .......... | 257/295 |
| 2004/0130936 A1* | 7/2004 | Nguyen et al. ....... | 365/158 |

OTHER PUBLICATIONS

U.S. Appl. No. 10/650,600, filed Aug. 28, 2003, assigned to the same assignee.

* cited by examiner

*Primary Examiner*—Tu-Tu Ho
(74) *Attorney, Agent, or Firm*—George D. Saile; Stephen B. Ackerman

(57) ABSTRACT

An MRAM array is formed of MTJ cells shaped so as to have their narrowest dimension at the middle of the cell. A preferred embodiment forms the cell into the shape of a kidney or a peanut. Such a shape provides each cell with an artificial nucleation site at the narrowest dimension, where an applied switching field can switch the magnetization of the cell in manner that is both efficient and uniform manner across the array.

3 Claims, 2 Drawing Sheets

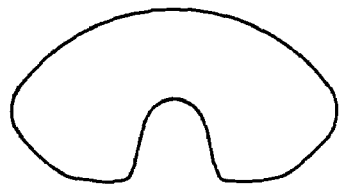
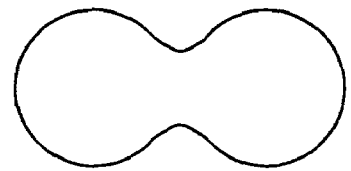
FIG. 1a          FIG. 1b
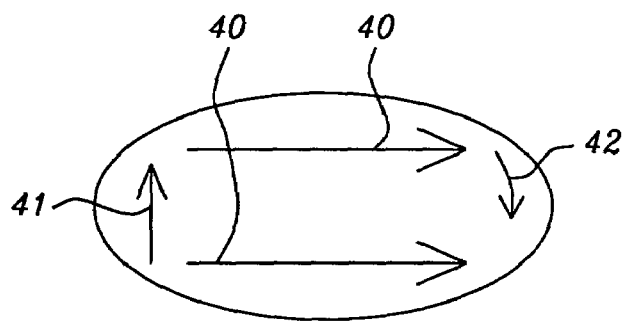
FIG. 2a – Prior Art
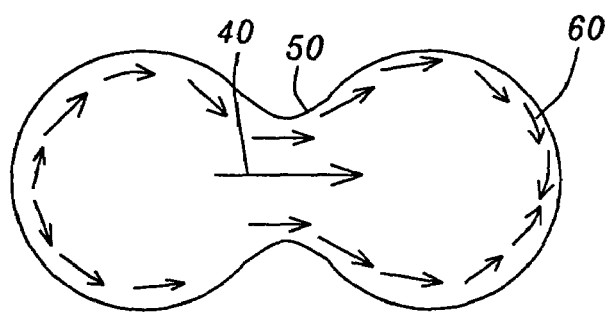
FIG. 2b

MAGNETIC RANDOM ACCESS MEMORY DESIGNS WITH CONTROLLED MAGNETIC SWITCHING MECHANISM

RELATED PATENT APPLICATION

This application is related to Ser. No. 10/650,600, filing date (Aug. 28, 2003), assigned to the same assignee as the current invention.

BACKGROUND OF THE INVENTION

1. Field of the Invention

This invention relates to the use of magnetic tunnel junctions (MTJ) as storage elements (cells) in non-volatile memory cell arrays, called magnetic random access memories (MRAM). In particular it relates to MRAM arrays whose cells have their narrowest dimension at or near their middle regions whereat they serve as nucleation sites for magnetization switching between multi-stable states.

2. Description of the Related Art

The magnetic tunnel junction (MTJ) basically comprises two electrodes, which are layers of ferromagnetic material, the electrodes being separated by a tunnel barrier layer, which is a thin layer of insulating material. The tunnel barrier layer must be sufficiently thin so that there is a probability for charge carriers (typically electrons) to cross the layer by means of quantum mechanical tunneling. The tunneling probability is spin dependent, depending on the orientation of the electron spin relative to the magnetization direction of the ferromagnetic layers. Thus, if these magnetization directions are varied, the tunneling current will also vary as a function of the relative directions for a given applied voltage. As a result of the behavior of an MTJ, sensing the change of tunneling current for a fixed potential can enable a determination of the relative magnetization directions of the two ferromagnetic layers that comprise it. Equivalently, the resistance of the MTJ can be measured, since different relative magnetization directions will produce different resistances.

The use of an MTJ as an information storage device requires that the magnetization of at least one of its ferromagnetic layers can be varied relative to the other and also that changes in the relative directions can be sensed by means of variations in the tunneling current or, equivalently, the junction resistance. In its simplest form as a two state memory storage device, the MTJ need only be capable of having its magnetizations put into parallel or antiparallel configurations (writing) and that these two configurations can be sensed by tunneling current variations or resistance variations (reading). In practice, the free ferromagnetic layer can be modeled as having a magnetization which is free to rotate but which energetically prefers to align in either direction along its easy axis. The magnetization of the fixed layer may be thought of as being permanently aligned in its easy axis direction (the direction of crystalline magnetic anisotropy). When the free layer is anti-aligned with the fixed layer, the junction will have its maximum resistance, when the free layer is aligned with the fixed layer, the minimum resistance is present. In typical MRAM circuitry, the MTJ devices are located at the intersection of current carrying lines called word lines and bit lines (or word lines and sense lines). When both lines are activated, the device is written upon, ie, its magnetization direction is changed. When only one line is activated, the resistance of the device can be sensed, so the device is effectively read. In this regard, Bronner et al. (U.S. Pat. No. 6,242,770 B1) teaches a method for forming thin film conductors as word and bit lines so that the MTJ device is in close proximity to a lower line and a diode is located below that line.

In order for the MTJ MRAM device to be competitive with other forms of DRAM, it is necessary that the MTJ be made very small, typically of sub-micron dimension. Such small sizes are associated with significant problems, particularly super-paramagnetism, which is thermal fluctuations of magnetization produced in samples of ferromagnetic material too small to have sufficient magnetic anisotropy (a measure of the ability of a sample to maintain a given magnetization direction).

Another size-related problem results from non-uniform and uncontrollable edge-fields produced by shape-anisotropy (a property of non-circular samples). As the cell size decreases, these edge fields become relatively more important than the magnetization of the body of the cell and have an adverse effect on the storage and reading of data. Although such shape-anisotropies, when of sufficient magnitude, reduce the disadvantageous effects of super-paramagnetism, they have the negative effect of requiring high currents to change the magnetization direction of the MTJ for the purpose of storing data. To counteract these edge effects, Shi et al. (U.S. Pat. No. 5,757,695) teaches the formation of an ellipsoidal MTJ cell wherein the magnetization vectors are aligned along the length (major axis) of the cell and which do not present variously oriented edge domains, high fields and poles at the ends of the element. In a similar approach, Anthony (U.S. Pat. No. 6,205,053 B1) teaches the formation of an MTJ device having first and second layers which are substantially "H" and "I" shaped. This shape allows the device to assume a predictable magnetization in spite of the variability of edge domain directions.

MTJ devices have been formed in several configurations, one type comprising a free ferromagnetic layer separated from a fixed (or pinned) layer. In such a configuration, the MTJ has data stored in it by causing the magnetization of its free layer to be either parallel or antiparallel to that of the pinned layer. The pinned layer may itself be a composite layer formed of two ferromagnetic layers held in an antiparallel magnetization configuration by some form of magnetic coupling so that it presents a zero or negligible net magnetic moment to the MTJ. Such an arrangement is advantageous in reducing edge effects due to anisotropies.

Koch et al. (U.S. Pat. No. 6,005,800) deal with the problem that results when writing to one specific cell also affects the magnetization directions of adjacent cells that are not being addressed. Koch teaches the formation of cells with two shapes, which are mirror images of each other. The cells are arranged in a checkerboard pattern, so that a cell of one shape is surrounded by cells of the other shape. Since neighboring cells thereby have their preferred magnetization vectors oriented differently, there is a reduced probability that writing to one cell type will affect the magnetization of the other type.

As has been discussed, many of the problems associated with the construction of MRAM arrays are related to the shapes of the cells. Cell shapes of prior art designs are typically single element rectangle, elliptical or lozenge. Any irregularities of these shapes, or defects at their edges produced during their formation, will result in coercivity fluctuations distributed throughout the array. It is the object of the present invention to control the problem of undesirable edge effects more effectively than in the prior art by forming single MTJ cell elements in a geometric shape in which the narrowest dimension is in the middle section of the element. This narrow region provides a nucleation site for switching between multi-stable states in the fanning mode and will dominate the adverse affects of unintentionally generated shape irregularities or edge defects.

SUMMARY OF THE INVENTION

A first object of this invention is to provide a novel MTJ device whose magnetization direction changing properties are insensitive to shape irregularities and edge defects and which can be used to form an MRAM array.

A second object of this invention is to provide an MRAM array of such MTJ devices, in which array coercivity variations and resulting switching field variations due to shape irregularities and edge defects in the MTJ devices is eliminated or greatly reduced.

A third object of this invention is to provide such an MRAM array in which problems of write selectivity, ie, writing onto unintended array locations, is eliminated or greatly reduced.

A fourth object of the present invention is to provide an MRAM cell array whose switching properties are uniform at all points of the array.

A fifth object of the present invention is to provide an MRAM cell array design in which the threshold for switching is reduced.

A sixth object of the present invention is to provide design control of MRAM cell coercivity.

These objects will be achieved by a design method that intentionally introduces nucleation sites in an MTJ memory cell by using photolithography and ion-milling to form these cells with their narrowest dimension near their middle region. These nucleation sites then lower the switching thresholds of individual cells in the array. The preferred embodiment of this invention includes cell shapes which are "kidney" and "peanut" shaped, but other shapes with narrow middle regions will also meet the objects of the invention. The MTJ design formed for the preferred application of this method comprises a ferromagnetic free layer separated by an insulating tunneling junction layer from a fixed (or pinned) layer which is a multilayer comprising a first ferromagnetic layer having a first magnetization direction, a non-magnetic coupling layer, a second ferromagnetic layer having a second magnetization direction opposite to the first direction and an antiferromagnetic layer which pins the ferromagnetic layers of the fixed layer in their mutually antiparallel configuration. The first and second ferromagnetic layers are directly coupled and their thicknesses are chosen to provide a net magnetic moment of the pinned layer which is substantially zero. The MTJ is formed as a layered sheet, which is then patterned by photolithographic design transfer and ion-milling into the required array of individual cells provided by the method.

BRIEF DESCRIPTION OF THE DRAWINGS

FIGS. 1a and b are schematic illustrations of two different design patterns of MTJ cells formed in accord with the present invention.

FIGS. 2a and b are schematic illustrations of symbolic magnetization vectors in a prior art single elliptical cell as compared to analogous vectors in a peanut-shaped cell.

DESCRIPTION OF THE PREFERRED EMBODIMENT

Figure 2C:
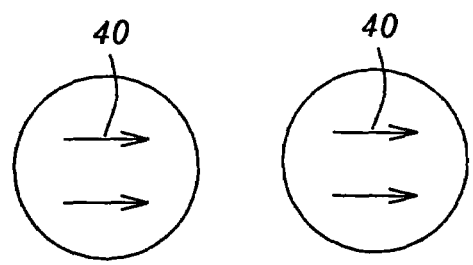
FIG. 2c shows the peanut shaped cell modeled as two adjacent circles.

The preferred embodiment of the present invention teaches a method of forming an individual MTJ memory cell or an MRAM array of such cells, wherein individual MTJ cells are shaped so as to have their narrowest dimension at their middle regions. An array of such cells thereby has a structure and design that provides a lowered threshold for state switching and a uniformity of coercivity across the array. The design offers at least the following three advantages: 1) a reduction of the switching field threshold dependence on individual cell geometry; 2) a preferred path of switching which is a fanning mode, wherein the ends of the magnetization vectors of individual segments are coupled at the segment edges; 3) artificial nucleation sites produced by segmentation and shape narrowing which provide significantly lower switching thresholds than the uncontrollable edge and shape defects common to unsegmented cells with prior art shapes.

Referring first to FIGS. 1a and b, there is shown two shapes, "kidney" and "peanut," that will accomplish the objects of the present invention.

Referring next to FIG. 2a, there is seen an elliptical element of the prior art alongside a peanut shaped element of the present invention. This is actually not an unreasonable comparison, since even lozenge shaped cells often have an elliptical appearance after they are formed by photolithographic processes. In what follows, referring to FIG. 2a, we will consider an ellipse (10) of aspect ratio, c/a=2, (ratio of semi-major axis, c, to semi-minor axis, a), which can be replaced in the present invention by the peanut shape as shown. The figure of the ellipse in FIG. 2a also shows magnetization vectors (40) of the ellipse aligned advantageously along the major axis and magnetization vectors (41) and (42) disadvantageously aligned along the direction of randomly formed edge domains (curling). The peanut shape acquires magnetization vectors all preferentially aligned along an easy axis and unidirectional (40) within the narrow middle region (50), yet forming a fanning mode (head-to-tail alignment) (60) as a result of the directional variations of the magnetization along the periphery of the peanut shape. It is this narrow middle region (50) that will serve as a nucleation site for low threshold magnetization switching. In existing prior art designs, such as the ellipse of FIG. 2a, even cell sizes smaller than a domain size will exhibit curling of the magnetization vectors at the cell edges (41 & 42) when the cell is isolated. This curling is a result of the reduction of magnetostatic energy within the isolated cell. If the magnetization vectors did not curl, there would be uncompensated poles at the ends of the cell, which is a higher magnetic energy state. Although the peanut shape also exhibits some degree of curling at its edges, the general formation of magnetization vectors (60) still results in a reduced threshold of magnetization switching.

The switching coercivity of a single elliptical cell, $H_c$, is given by:

$$H_c = 2K_u/M_s + (N_a - N_c)M_s.$$

In this expression $K_c$ is the crystalline anisotropy, which is determined by film composition and processing conditions and is independent of the cell geometry. The term $(N_a-N_c)M_s$ represents the shape anisotropy of the cell. For an aspect ratio $c/a=2$, $(N_a-N_c)=4.6425t/a$, where t is the film thickness. Thus the shape anisotropy is directly proportional to $M_s t$ and is inversely proportional to feature size (represented by a).

The super-paramagnetic limit requires that, to prevent thermal fluctuations of the magnetization, $M_s t > 50\ kT/(H_c S)$, where k is Boltzmann's constant, T is the absolute temperature and S is the cell area (sac for an ellipse). Thus, when scaling down cell area for high density applications and simultaneously attempting to maintain thermal stability, the coercivity will have to increase as a function of $1/a^2$ for a constant aspect ratio. Since the magnetic field produced by the current in the bit line is only proportional to $1/a$, this means that much more current is required at reduced cell sizes to overcome the increasing coercivity.

For an indication of the advantages of the peanut shape, we can approximate its magnetic properties by modeling it as two adjacent circles, with their magnetizations (40) as shown in FIG. 2c. The coercivity of two circles is:

$$H_c = 2K_c/M_s + NiM_s,$$

because the circular shape does not produce a shape anisotropy. Instead, there is an interaction anisotropy term, $N_i M_s$, which is given by:

$$N_i = \pi/4t(a^2/s^3) = 0.785t\ (a^2/s^3),$$

where s is the center-to-center distance between the circles. This term is less than 17% of the shape anisotropy contribution, depending on the value of s. It is noted that the coercivity of the peanut shaped cell is dominated by the crystalline anisotropy term, $2K_c/M_s$, whereas the coercivity of the original ellipse was dominated by the shape anisotropy, $(N_a-N_c)M_s$. Thus, the method of the present invention reduces the write power consumption and allows scaling to smaller dimensions.

The greatest advantage of the present invention is the ability it provides to control the switching mode during magnetization reversals. In prior art designs, any imperfection of the edge or shape of the ellipse or lozenge cells, or any defects within the cell, will serve as a nucleation site for magnetization switching and significantly reduce the switching threshold. Since these defects are uncontrollable, the variations in switching threshold will be randomly distributed among the cells in the array. In the present invention, the edges at the inside regions of the segments forming the cell will serve as artificial nucleation sites for the magnetization switching. As long as the role of the artificial sites dominates that of defects, the switching threshold will be determined by the intentional design and not by the random distribution of defects.

Figure 3A:
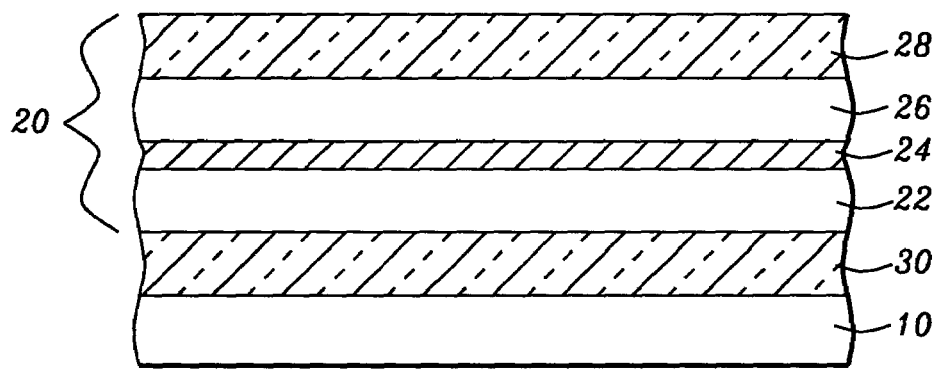
FIG. 3a is a schematic cross-sectional illustration of a MTJ configuration suitable for use in a discrete cell element of the present invention. The MTJ configuration has an antiferromagnetically coupled fixed layer formed in accord with the method of this invention.

Referring to FIG. 3a, there is shown a cross-sectional view of an MTJ segment designed to efficiently achieve the objects of the present invention. It is understood that this segment is formed by ion-milling and photolithographic patterning of a larger sheet of MTJ layers as described below.

Referring to the figure, there is seen an MTJ segment formed of a ferromagnetic free layer (10) separated by an insulating tunneling layer (30) from a magnetically pinned layer (20). The pinned layer is itself a multilayer, comprising a first ferromagnetic layer (22) and a second ferromagnetic layer (26) separated by a coupling layer (24) formed of non-magnetic coupling materials such as Rh, Ru, Cr or Cu and formed to a thickness between approximately 5 and 50 angstroms. Ferromagnetic layers are preferably formed of materials such as CoFe, NiFe, CoNiFe, CoZrTa, CoFeB or CoHfTa. The insulating tunneling layer is preferably formed of oxides such as $Al_2O_3$, $ZrO_2$ or $HfO_2$ (or combinations thereof) to a thickness between approximately 5 and 50 angstroms. The magnetizations of the first and second ferromagnetic layers are strongly coupled in antiparallel directions and pinned by an antiferromagnetic layer (28) such as a layer of PtMn, NiMn, OsMn, IrMn, NiO or CoNiO, positioned adjacent to the second ferromagnetic layer and formed to a thickness between approximately 30 and 300 angstroms. The material composition and thicknesses of the first and second ferromagnetic layers are chosen so that their magnetizations are essentially equal in magnitude. Thus, when the magnetizations are fixed in opposite directions, the net magnetic moment of the pinned layer is substantially zero.

Figure 3B:
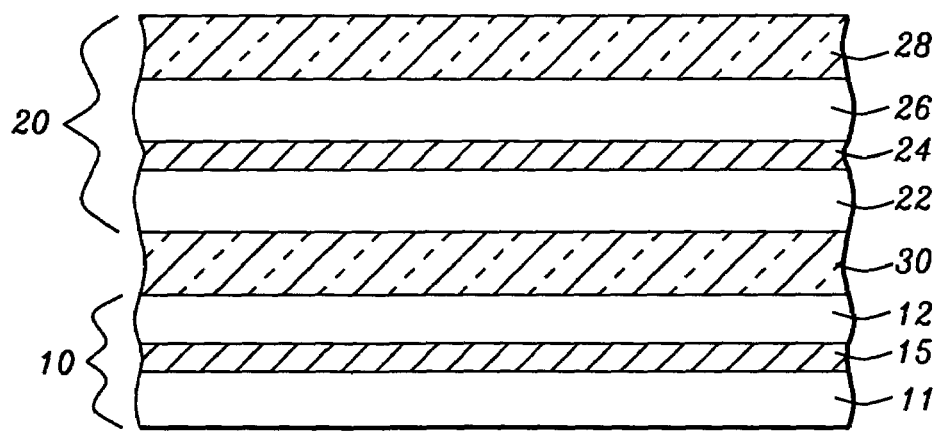
FIG. 3b shows the configuration of 3a with the addition of a multilayered free layer.

Also within the capabilities of the present preferred embodiment and as shown in FIG. 3b, is the formation of the ferromagnetic free layer (10) as a multilayer comprising two ferromagnetic layers ((11) and (12)) of opposite magnetizations separated by a non-magnetic spacer layer (15), much as in the fixed layer formation. By choosing the thickness of the spacer layer, the free layer ferromagnetic layers can be coupled either weakly (magnetostatically coupled) or strongly (exchange coupled).

It is understood that an MTJ of the type described above can be formed into peanut and kidney shaped segments in accord with the objects of the present invention using photolithographic and ion-milling methods well know to those skilled in the art. In particular, an MTJ stack is first formed as a sheet of the MTJ layers described above and then, using photolithographic and ion-milling processes, the sheet is patterned into appropriately shaped cells wherein individual cells can have dimensions within an approximate range between 0.05 and 1.5 microns. Also, as is known by practitioners of the art, the magnetic layers of the MTJ stack can be formed with an arbitrarily chosen direction of crystalline anisotropy, so that the segments can be aligned with the line joining their centers having a desired angle with the direction of crystalline anisotropy.

As is understood by a person skilled in the art, the preferred embodiment of the present invention is illustrative of the present invention rather than being limiting of the present invention. Revisions and modifications may be made to methods, processes, materials, structures, and dimensions through which is formed an MTJ element whose arrowest dimension is at its middle, to provide a lowered threshold for state switching and a uniformity of coercivity across an MRAM the array, while still providing an MTJ element whose arrowest dimension is at its middle, to provide a lowered threshold for state switching and a uniformity of coercivity across an MRAM the array, formed in accord with the present invention as defined by the appended claims.

The invention claimed is:

1. A method for fabricating a magnetic tunnel junction (MTJ) cell, said cell having a narrow dimension at its middle whereat artificial nucleation sites for magnetization switching are formed and said cell having an easy axis of magnetization passing longitudinally through said middle, thereby producing a fanning mode of magnetization vectors at opposite peripheral edges of said cell and, as a result, said cell having a lowered switching field threshold and a reduced sensitivity to defects and shape irregularities comprising:

forming an MTJ layered stack, the magnetic layers of said stack having a common crystalline anisotropy and common easy axis of magnetization;

patterning within said stack, by photolithography and ion-milling methods, at least one MTJ cell having a narrow dimension at its middle, said dimension being transverse to the direction of said easy axis of magnetization.

2. The method of claim 1 wherein the method of forming the MTJ stack further comprises:

forming a ferromagnetic free layer;

forming an insulating tunneling layer on said free layer;

forming a multi-layered magnetically pinned layer on said tunneling layer, said pinned layer formation further comprising:

forming a first ferromagnetic layer adjacent to said tunneling layer;

forming a non-magnetic coupling layer on said first ferromagnetic layer;

forming a second ferromagnetic layer on said coupling layer;

forming an antiferromagnetic pinning layer on said second ferromagnetic layer, wherein said multi-layered magnetically pinned layer has a net magnetic moment which is substantially zero as a result of the magnetic moments of said first and second ferromagnetic layers being substantially equal and strongly magnetically coupled in an anti-parallel configuration.

3. The method of claim 2 wherein said free magnetic layer is formed as a multilayer comprising a third and fourth ferromagnetic layer separated by a non magnetic spacer layer and wherein the magnetizations of said ferromagnetic layers may be weakly or strongly coupled in antiparallel directions.

* * * * *